US008957394B2

(12) United States Patent
Brodie et al.

(10) Patent No.: US 8,957,394 B2
(45) Date of Patent: Feb. 17, 2015

(54) COMPACT HIGH-VOLTAGE ELECTRON GUN

(71) Applicant: KLA-Tencor Corporation, Milpitas, CA (US)

(72) Inventors: Alan D. Brodie, Palo Alto, CA (US);
Joseph Maurino, San Mateo, CA (US);
Mark A. McCord, Los Gatos, CA (US);
Paul F. Petric, Pleasanton, CA (US)

(73) Assignee: KLA-Tencor Corporation, Milipitas, CA (US)

( * ) Notice: Subject to any disclaimer, the term of this patent is extended or adjusted under 35 U.S.C. 154(b) by 0 days.

(21) Appl. No.: 13/679,072

(22) Filed: Nov. 16, 2012

(65) Prior Publication Data

US 2013/0134324 A1    May 30, 2013

Related U.S. Application Data

(60) Provisional application No. 61/564,740, filed on Nov. 29, 2011.

(51) Int. Cl.
| | |
|---|---|
| *H01J 23/06* | (2006.01) |
| *H01J 23/08* | (2006.01) |
| *G21K 5/08* | (2006.01) |

(Continued)

(52) U.S. Cl.
CPC . *H01J 23/06* (2013.01); *G21K 5/08* (2013.01);
*H01J 37/065* (2013.01); *H01J 29/48* (2013.01);
*H01J 29/488* (2013.01); *H01J 23/08* (2013.01);
*H01J 2237/038* (2013.01);

(Continued)

(58) Field of Classification Search
CPC .................. H01J 37/48; H01J 37/481–37/488;
H01J 37/06; H01J 37/065; H01J 29/48;
H01J 29/481–29/488
USPC ....... 250/423 R; 313/460, 364, 421, 426–426
See application file for complete search history.

(56) References Cited

U.S. PATENT DOCUMENTS 3,201,637 A * 8/1965 Snyder .......................... 313/256
3,729,575 A * 4/1973 Harding et al. ........... 174/138 R (Continued)

FOREIGN PATENT DOCUMENTS

| EP | 1 998 355 A3 | 3/2003 |
|---|---|---|
| EP | 1 986 051 A3 | 10/2008 |

(Continued)

OTHER PUBLICATIONS

PCT International Search Report and Written Opinion of the International Searching Authority for Application No. PCT/US12/066750, Mar. 14, 2013, 7 sheets.

*Primary Examiner* — Jack Berman
*Assistant Examiner* — Kevin Chung
(74) *Attorney, Agent, or Firm* — Okamoto & Benedicto LLP

(57) ABSTRACT

One embodiment relates to a high-voltage electron gun including an insulator stand-off having a resistive layer. The resistive layer is at least on an interior surface of the insulator stand-off. A cathode holder is coupled to one end of the insulator 115 stand-off, and an anode is coupled to the other end. The resistive layer advantageously increases the surface breakdown field strength for the insulator stand-off and so enables a compact design for the high-voltage electron gun. Other embodiments, aspects and feature are also disclosed.

15 Claims, 6 Drawing Sheets

(51) Int. Cl.
*H01J 37/065* (2006.01)
*H01J 29/48* (2006.01)

(52) U.S. Cl.
CPC .............. *H01J 2237/06341* (2013.01); *H01J 2237/06375* (2013.01); *H01J 2237/3175* (2013.01)
USPC ....... 250/423 R; 313/426; 313/460; 313/382; 313/427

(56) References Cited

U.S. PATENT DOCUMENTS

| | | | |
|---|---|---|---|
| 3,842,495 A | 10/1974 | Bennett et al. | |
| 4,101,803 A * | 7/1978 | Retsky et al. | 315/3 |
| 4,414,485 A * | 11/1983 | Marschka | 313/451 |
| 4,427,886 A * | 1/1984 | Martin et al. | 250/310 |
| 4,641,103 A * | 2/1987 | Madey et al. | 315/507 |
| 4,910,249 A * | 3/1990 | Kania et al. | 524/555 |
| 5,854,822 A | 12/1998 | Chornenky et al. | |
| 5,895,303 A * | 4/1999 | Kimura et al. | 445/34 |
| 6,048,244 A * | 4/2000 | Osborne et al. | 445/36 |
| 6,328,621 B2 * | 12/2001 | Kudoh et al. | 250/396 R |
| 6,533,963 B1 | 3/2003 | Schleifstein | |
| 7,053,538 B1 * | 5/2006 | Ha et al. | 313/309 |
| 7,465,922 B1 | 12/2008 | McCord | |
| 7,573,046 B1 | 8/2009 | Chubun | |
| 7,821,187 B1 | 10/2010 | Jiang et al. | |
| 2002/0089277 A1 * | 7/2002 | Skupien | 313/460 |
| 2002/0125808 A1 * | 9/2002 | Bartch et al. | 313/402 |
| 2003/0020389 A1 * | 1/2003 | Hwang | 313/427 |
| 2003/0025437 A1 * | 2/2003 | Wakita et al. | 313/449 |
| 2003/0214260 A1 * | 11/2003 | Cho | 315/368.11 |
| 2005/0194535 A1 * | 9/2005 | Noji et al. | 250/311 |
| 2007/0228297 A1 * | 10/2007 | Ogasawara | 250/492.22 |

FOREIGN PATENT DOCUMENTS

| | | |
|---|---|---|
| RU | 1501829 A1 | 9/1995 |
| RU | 2 206 187 C1 | 10/2003 |
| RU | 2003 126 745 A | 1/2006 |

\* cited by examiner

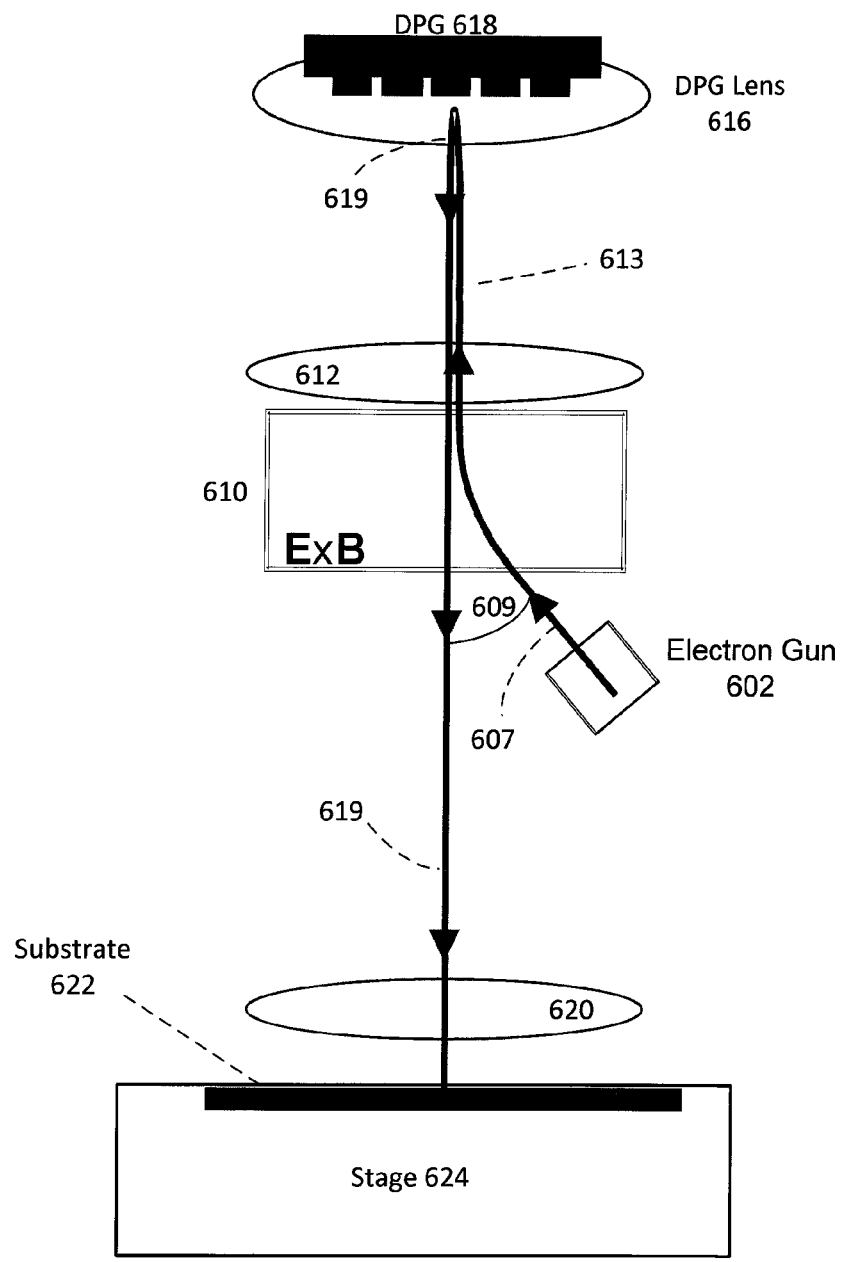
FIG. 6        600

US 8,957,394 B2

COMPACT HIGH-VOLTAGE ELECTRON GUN

CROSS-REFERENCE TO RELATED APPLICATION(S)

The present application claims the benefit of provisional U.S. Patent Application No. 61/564,740, filed Nov. 29, 2011, entitled "Compact High Voltage Electron Gun," the disclosure of which is hereby incorporated by reference.

STATEMENT REGARDING FEDERALLY SPONSORED RESEARCH OR DEVELOPMENT

This invention was made with Government support under Agreement No. HR0011-07-9-0007 awarded by DARPA. The Government has certain rights in the invention.

BACKGROUND

1. Technical Field

The present invention relates to high-voltage electron guns and apparatus which use high-voltage electron guns.

2. Description of the Background Art

High-voltage electron guns are well known in various fields for instance as a source of electrons in electron beam lithography (as used for fabrication of semiconductor masks, for example) and also in scanning electron microscopes, electron beam testing of integrated circuits and line width metrology measuring equipment as used in the semiconductor industry. Such guns also have application outside of the semiconductor industry, for instance in scanning electron microscopes, generally.

It is highly desirable to improve high-voltage electron guns.

SUMMARY

One embodiment relates to a high-voltage electron gun including an insulator stand-off having a resistive layer. The resistive layer is at least on an interior surface of the insulator stand-off. A cathode holder is coupled to one end of the insulator stand-off, and an anode is coupled to the other end. The resistive layer advantageously increases the surface breakdown field strength for the insulator stand-off and so enables a compact design for the high-voltage electron gun.

Another embodiment relates to a method of forming an electron beam in an electron gun. Electrons are emitted from a cathode emitter into a gun chamber with an insulator stand-off which includes a resistive layer on its surface. The gun chamber is formed by the insulator stand-off, a cathode holder at a first end of the insulator stand-off, and an anode at a second end of the insulator stand-off. An electron beam is formed in the gun chamber, and the electron beam is accelerated out of an opening in the anode.

Another embodiment relates to an apparatus for electron beam lithography. The apparatus includes an electron gun having an insulator stand-off with a resistive layer on its surface. The apparatus further includes a pattern generator array, an imaging system, and a stage for holding a target substrate. The pattern generator array is illuminated by the incident electron beam and reflects a patterned array of electron beams. The imaging system focuses and de-magnifies the patterned array of electron beams, and the stage holds the target substrate under the patterned array of electron beams.

Other embodiments, aspects and feature are also disclosed.

BRIEF DESCRIPTION OF THE DRAWINGS

FIG. 6 is a schematic diagram showing a cross-sectional view of a reflection electron beam lithography apparatus in accordance with an embodiment of the invention.

Note that the figures are not necessarily to scale and are intended to illustrate embodiments of the invention for purposes of providing a clear explanation of the invention.

DETAILED DESCRIPTION

Conventional high-voltage electron guns may utilize high-voltage insulators, such as alumina ceramic. Alumina ceramic has a maximum electric field across the surface of the standoff of 1 kV/mm. Hence, for a gun operating at 50 kV, the minimum size of the electrical insulation would be 50 mm. Similarly, for a gun operating at 100 kV, the minimum size of the electrical insulation would be 100 mm. These minimum sizes are relatively long and result in a relatively long illumination path length within the electron beam apparatus.

A long illumination path length is generally undesirable due to increased Coulomb interactions between electrons in the incident electron beam. One objective of the presently-disclosed invention is to provide a compact electron gun that may be used to shorten the illumination path length and so reduce Coulomb interactions between electrons in the incident electron beam.

Figure 1:
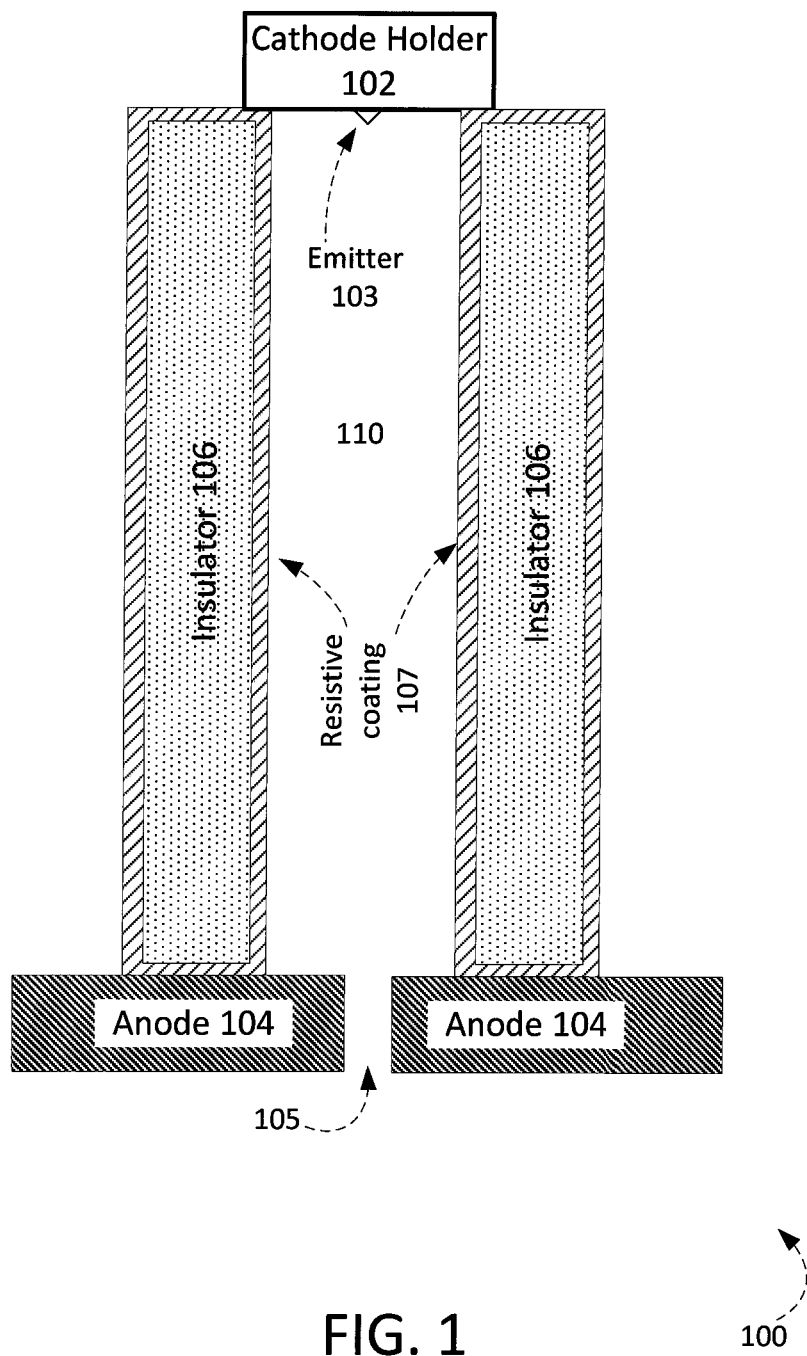
FIG. 1 is a schematic diagram showing a cross-sectional view of a high-voltage compact electron gun in accordance with an embodiment of the invention.

FIG. 1 is a schematic diagram showing a cross-sectional view of a high-voltage compact electron gun 100 in accordance with an embodiment of the invention. The electron gun includes a cathode holder 102 which holds a cathode emitter 103, an anode 104 having an opening 105, and an insulator 106 which has a resistive layer 107. (Note that the resistive layer 107 is generally a relatively thin layer and is depicted in the figures with an exaggerated thickness in the figures for ease of viewing.)

The insulator 106 has a first end at which the cathode holder 102 is attached and a second end at which the anode 104 is attached. Hence, the insulator 106, the cathode holder 102, and the anode 104 together form a small vacuum chamber (gun chamber) 110.

In an exemplary embodiment, the insulator 106 may be cylindrical in form with two circular ends, and the anode 104 may comprise a circular disc with the opening 105 in its center. It is possible that other shapes may be used. The resistive layer 107 may cover at least the interior surface of the insulator 106. In one implementation, the resistive layer 107 covers all surfaces of the insulator 106.

A voltage difference is maintained between the anode 104 and the cathode emitter 103 such that the anode 104 is at a highly positive voltage relative to the cathode 102. For example, a high negative voltage may be applied to the cathode emitter 103, while the anode 104 may be connected to an electrical ground. The voltage difference between the anode 104 and cathode 102 may be in a range from 10 kilovolts (kV) to 10 megavolts (MV) such that the electron beam has an energy in the range from 10 kilo electron volts (keV) to 10 mega electron volts (MeV).

Due to the aforementioned voltage difference, electrons are extracted from the cathode emitter 103 and accelerated towards the anode 104. The extracted electrons are confined and focused in the chamber 110 and output as an electron beam from the opening 105 in the anode 104.

The cathode emitter 103 may be, for example, a Hafnium carbide (HfC) emitter that is mounted on a Vogel mount. Other types of cathode emitters may be used. The anode 104 may be made of a refractory metal, such as, for example, molybdenum, titanium, tungsten, or an alloy material. The insulator 106 may be made of a material that is appropriate for a high voltage insulator. For example, a conductive ceramic, such as alumina ceramic, may be used.

The resistive layer 107 on the insulator 106 preferably has a sheet resistance within a range of $10^6$ to $10^{15}$ ohms per square. The resistive layer 107 advantageously increases the breakdown field at the surface of the insulator stand-off. For example, applicants were able to increase the surface breakdown from 1 kV/mm for alumina ceramic to 4.5 kV/mm for alumina ceramic with a resistive layer on its surface.

In accordance with one embodiment of the invention, the resistive layer 107 is a thin film that may be 100 nanometers (nm) thick, or more generally, have a thickness in a range from 5 nm to 100 microns. Advantageously, with the thin film, the conductivity of the material may be much higher for a given leakage current so as to more effectively drain unwanted charge. Such a thin film may be applied using atomic layer deposition (ALD) with appropriate precursor materials. For example, the ALD film may comprise a mixture of metal and metal oxide, such as, for example, titanium-alumina, tantalum-niobium oxide, zinc-alumina, zinc-zirconia, tin-alumina, or other metal plus metal-oxide compositions.

In accordance with another embodiment of the invention, the resistive layer 107 may be formed by diffusing metal into a surface of the ceramic. The diffusion may be performed, for example, by placing a semiconducting material so that it abuts a surface of the ceramic insulator. During the firing process, the semiconductor then diffuses slightly into the surface of the ceramic insulator so as to produce a gradient of conductivity at the surface. Advantageously, since the conductive material is mainly on the surface, the leakage current is small so that the insulator does not heat up.

In accordance with other embodiments of the invention, the resistive layer 107 may be a diamond-like carbon coating or a silicon-based coating (such as, silicon chromate, for example). Methods of applying the coating 107 include using a spray-on coating or sputtering.

Figure 2:
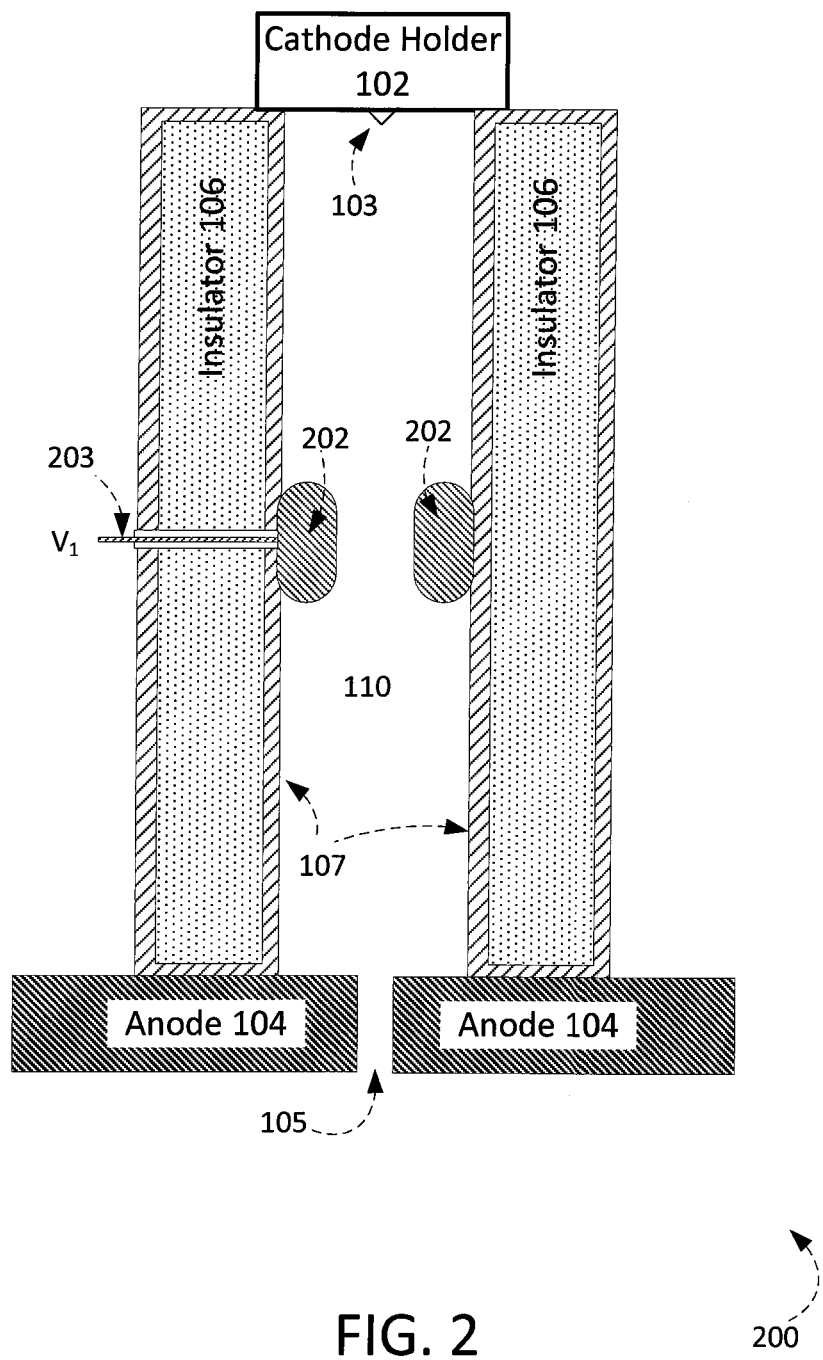
FIG. 2 is a schematic diagram showing a cross-sectional view of a high-voltage compact electron gun incorporating one controllable lens in accordance with an embodiment of the invention.

FIG. 2 is a schematic diagram showing a cross-sectional view a high-voltage compact electron gun 200 incorporating one controllable lens in accordance with an embodiment of the invention. In addition to the components of the electron gun 100 in FIG. 1, the electron gun 200 in FIG. 2 includes an electrode 202 within the gun chamber 110 and an electrical connection 203 through the insulator 106 to apply a control voltage $V_1$ to the electrode 202.

In one implementation, as shown, the electrode 202 may be ring shaped. The electrode 202 preferably has rounded edges to avoid sharp corners. The voltage $V_1$ applied to the electrode 202 may be adjusted to control the focusing of the electron beam formed in the gun chamber 110.

Figure 3:
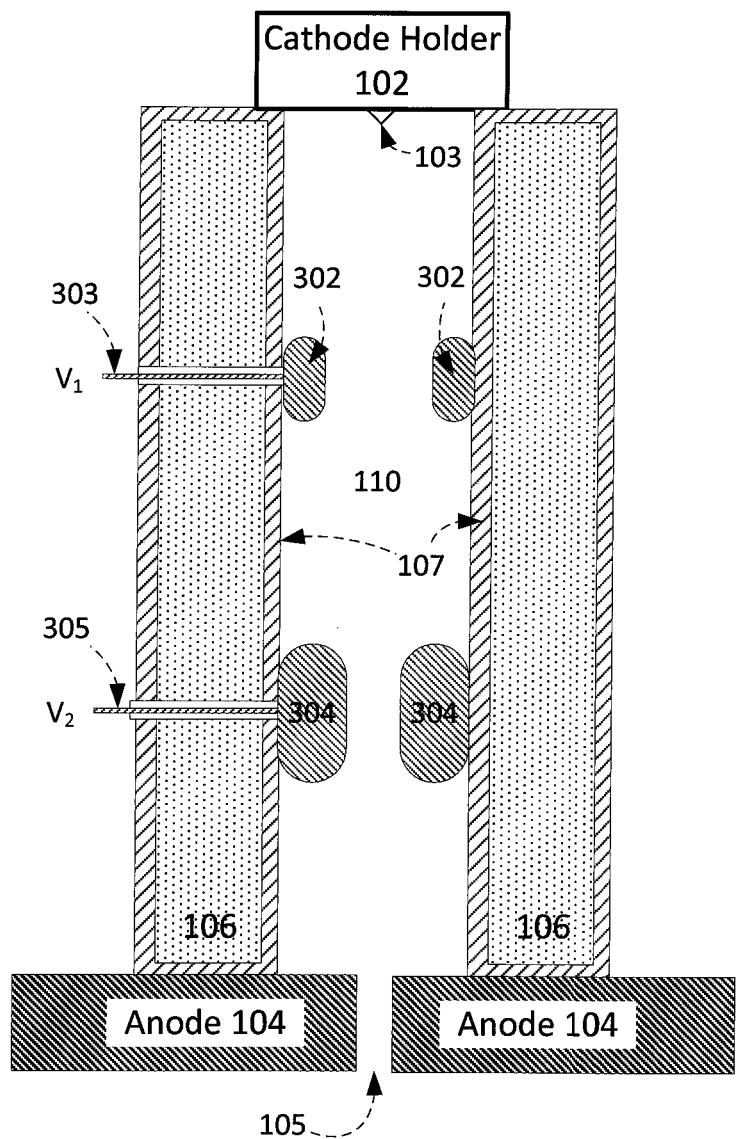
FIG. 3 is a schematic diagram showing a cross-sectional view of a high-voltage compact electron gun incorporating two controllable lenses in accordance with an embodiment of the invention.

FIG. 3 is a schematic diagram showing a cross-sectional view of a high-voltage compact electron gun 300 incorporating two controllable lenses in accordance with an embodiment of the invention. In addition to the components of the electron gun 100 in FIG. 1, the electron gun 300 in FIG. 3 includes a first electrode 302 within the gun chamber 110 and a first electrical connection 303 through the insulator 106 to apply a first control voltage $V_1$ to the first electrode 302. The electron gun 300 further includes a second electrode 304 spaced apart from the first electrode 302 within the gun chamber 110 and a second electrical connection 305 through the insulator 106 to apply a second control voltage $V_2$ to the second electrode 304.

In one implementation, as shown, the electrodes (302 and 304) may be ring shaped. The electrodes 302 and 304 preferably have rounded edges to avoid sharp corners. The first electrode 302 may be positioned closer to the cathode emitter 103 and may be smaller in size than the second electrode 304. The voltages $V_1$ and $V_2$ applied to the electrodes (302 and 304) may each be adjusted to control the focusing of the electron beam formed in the gun chamber 110.

Figure 4:
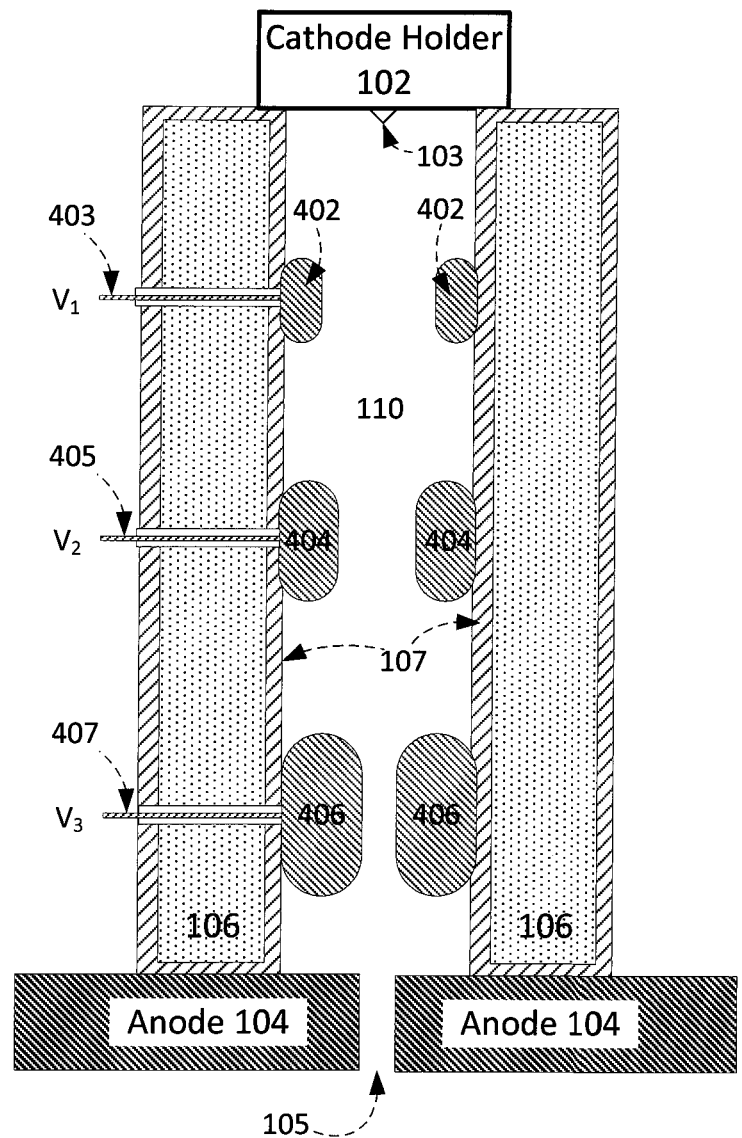
FIG. 4 is a schematic diagram showing a cross-sectional view of a high-voltage compact electron gun incorporating three controllable lenses in accordance with an embodiment of the invention.

FIG. 4 is a schematic diagram showing a cross-sectional view of a high-voltage compact electron gun 400 incorporating three controllable lenses in accordance with an embodiment of the invention. In addition to the components of the electron gun 100 in FIG. 1, the electron gun 400 in FIG. 4 includes a first through third electrodes (402, 404 and 406) within the gun chamber 110 and first through third electrical connections (403, 405 and 407) through the insulator 106. The first through third electrical connections (403, 405 and 407) apply the first through third control voltages ($V_1$, $V_2$ and $V_3$), respectively, to the first through third electrodes (402, 404 and 406).

In one implementation, as shown, the electrodes (402, 404 and 406) may be ring shaped. The electrodes (402, 404 and 406) preferably have rounded edges to avoid sharp corners. The first electrode 402 may be positioned closer to the cathode emitter 103 and may be smaller in size than the second electrode 404, and the second electrode 404 may be positioned closer to the cathode emitter 103 and may be smaller in size than the third electrode 406. The voltages $V_1$, $V_2$ and $V_3$ applied to the electrodes (402, 404 and 406) may each be adjusted to control the focusing of the electron beam formed in the gun chamber 110.

Figure 5:
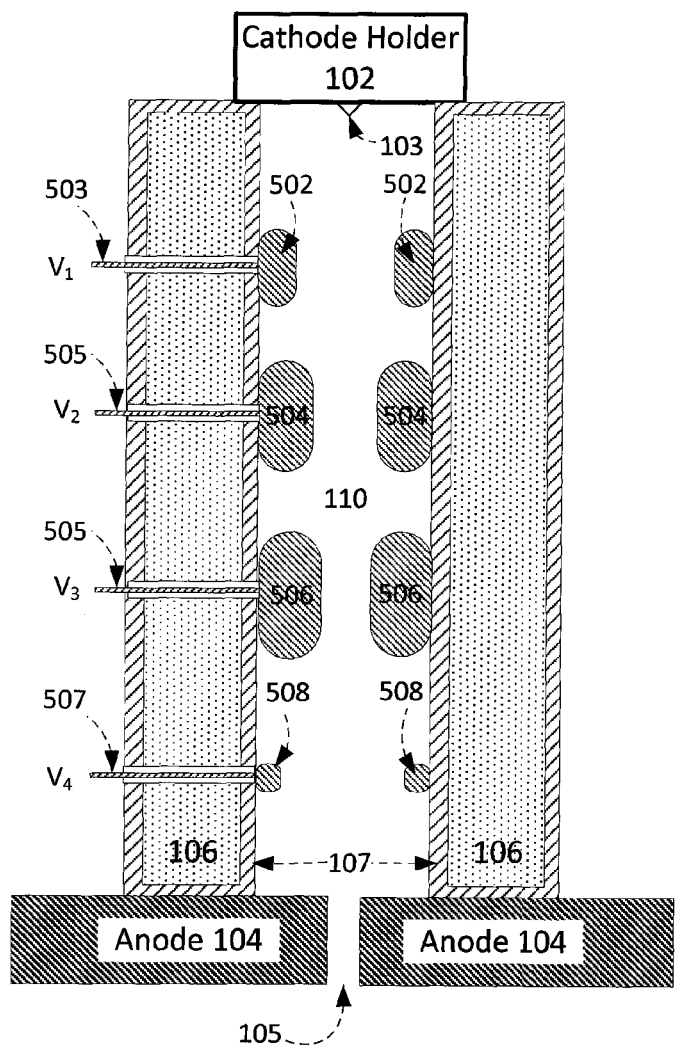
FIG. 5 is a schematic diagram showing a cross-sectional view of a high-voltage compact electron gun incorporating four controllable lenses in accordance with an embodiment of the invention.

FIG. 5 is a schematic diagram showing a cross-sectional view of a high-voltage compact electron gun 500 incorporating four controllable lenses in accordance with an embodiment of the invention. In addition to the components of the electron gun 100 in FIG. 1, the electron gun 500 in FIG. 5 includes a first through fourth electrodes (502, 504, 506 and 508) within the gun chamber 110 and first through fourth electrical connections (503, 505, 507 and 509) through the insulator 106. The first through fourth electrical connections (503, 505, 507 and 509) apply the first through fourth control voltages ($V_1$, $V_2$, $V_3$, and $V_4$), respectively, to the first through fourth electrodes (502, 504, 506 and 508).

In one implementation, as shown, electrodes (502, 504, 506 and 508) may be ring shaped. The electrodes (502, 504, 506 and 508) preferably have rounded edges to avoid sharp corners. The first electrode 502 may be positioned closer to the cathode emitter 103 and may be smaller in size than the second electrode 504. Similarly, the second electrode 504 may be positioned closer to the cathode emitter 103 and may be smaller in size than the third electrode 506. The fourth electrode 508 may be positioned closer to the anode 104 and may be smaller in size than the third electrode 506. The voltages $V_1$, $V_2$, $V_3$ and $V_4$ applied to the electrodes (502, 504, 506 and 508) may each be adjusted to control the focusing of the electron beam formed in the gun chamber 110.

In one particular implementation, the voltage difference between the cathode emitter 103 and the anode 104 may be 100 kV, and the control voltages ($V_1$, $V_2$, $V_3$ and $V_4$) on the control electrodes (502, 504, 506 and 508) may be distributed such that the maximum voltage drop across any two adjacent electrodes (including the cathode emitter 103 and the anode 104) is 33 kV. Distributing the voltage drop in this manner further reduces the chance for high-voltage breakdown. In such an implementation, the distance (path length) between the cathode emitter 103 and the anode 104 has been advantageously shortened to 280 mm in length.

Exemplary Use in an Apparatus for Electron Beam Lithography

One application of the compact high-voltage electron gun disclosed herein is in an apparatus for electron beam lithography. To pattern features at high resolution with electron beams, the energy of the electron beam is typically at high energy, such as, for example, greater than 50 keV. The reason high-energy electrons are used is that they have less lateral scattering in resist. In addition to scattering in resist, electron resolution degrades due to electron-electron interactions with lower energy electrons. To generate high energy electrons, an electron gun is used. The electron gun consists of a cathode floating at high (negative) voltage to generate the electrons and electrodes to accelerate and focus the beam. To isolate the voltages on the acceleration and focusing electrodes, high alumina ceramic insulators may be used.

To prevent arcing or dielectric breakdown, design rules are used when using high voltage insulation. Dielectric or insulator breakdown can occur along the surface or through the bulk material. The most common material used in electron devices is alumina ceramic. Clean alumina ceramic has a bulk dielectric breakdown of 20 kV/mm and a surface breakdown in vacuum of 1 kV/mm. Surface breakdown can occur at lower electric fields due to other conditions, such as surface contamination, a low vacuum level, and radiation from electrons, ions or x-rays.

In an aggressive design, in order to standoff 100 kV, a minimum of 100 mm length would be needed between the anode and cathode. This length does not include the electrodes themselves but only the insulator. Designing near the minimum 1 kV/mm involves the risk of surface breakdown in the electron gun. This is because the free electrons hitting the walls may charge up the insulator and create an imbalance or may create ions that charge the insulator.

An embodiment of the presently-disclosed invention may be advantageously used in an electron beam lithography apparatus. By using the resistive layer disclosed herein, the surface breakdown for the insulator stand-off within the electron gun may be increased substantially, for example, from 1 kV/mm to 4.5 kV/mm. This enables the implementation of a compact high-voltage electron gun with a substantially shorter path length for the illumination beam and so reduces Coulomb interactions in the beam.

FIG. 6 is a schematic diagram showing a cross-sectional view of a reflection electron beam lithography apparatus 600 in accordance with an embodiment of the invention. The apparatus 600 includes an electron gun 602 which may be one of the electron guns (100, 200, 300, 400 or 500) described above in relation to FIGS. 1-5. The electron guns (100, 200, 300, 400 or 500) described above may also be used in electron beam imaging apparatus or other apparatus employing an electron beam.

As shown in FIG. 6, the electron gun 602 may be configured to output an electron beam 607 towards an ExB separator 610. The ExB separator 610 comprises a Wien filter and may be arranged just below a first demagnification (demag) lens 612 and may be arranged to bend or deflect the trajectory of the electron beam 607 towards a dynamic pattern generator (DPG) 618. This deflection occurs because the velocity of the electrons comprising the electron beam is predominantly in such a direction so that the electric force and magnetic force of the ExB separator (which are of equal value) add, doubling the deflection force. The angle of deflection 609 is relatively small, for example, in a range of 10 to 20 degrees. (The angle of deflection 609 by the separator 610 is also the angle of incidence 609 of the electron beam 607 into the separator 610.)

A first demagnification (demag) lens 612 may focus the re-directed electron beam 613 so as to form a crossover above the first demag lens 612 and form a magnified image of the cathode onto the DPG 618. The magnified image of the cathode may be made intentionally slightly out of focus in order to obtain increased illumination uniformity at the DPG 618. The DPG lens 616 may be an electrostatic lens which decelerates the electrons of the re-directed electron beam 613 to within a few volts of the cathode potential. The DPG lens 616 may comprise, for example, an immersion cathode lens which is configured to deliver an effectively uniform current density (i.e. a relatively homogeneous flood beam) over a large area in a plane at the surface of the DPG 618.

The DPG 618 may include a two-dimensional array of pixels. Each pixel may include an electrically conductive contact to which a voltage level is controllably applied. Alternatively, the dynamic pattern generator may be replaced by another patterned electron reflector, such as, for example, a static patterned electron reflector in which the pattern is not dynamically configurable.

As the reflected electrons 619 leave the DPG 618, the DPG lens 616 re-accelerates the reflected electrons 619 toward their second pass through the first demag lens 612 and the ExB separator 610. The ExB separator 610 is configured to receive the reflected electrons 619 from the first demag lens 612 and to pass (without deflection) the reflected electrons towards the second (final) demag lens 620. In this case the electrons comprising the electron beam past without deflection because their velocity is predominantly in such a direction so that the electric force and magnetic force of the ExB separator cancel. As shown, the projection axis (vertical in FIG. 6) going from the DPG 618 to the stage 624 is straight in the embodiment depicted.

The final demag lens 620 is positioned between the ExB separator 610 and the target substrate 622. The final demag lens 620 is configured to focus the reflected electron beam 619 and demagnify the beam onto a surface of the target substrate 622. The target substrate 622 may be, for example, a semiconductor wafer with a photoresist layer on its surface. The blur and distortion due to the final demag lens 620 is preferably a fraction of the pixel size.

The substrate stage 624 holds the target substrate 622. In one embodiment, the stage 624 is stationary during the lithographic projection. In another embodiment, the stage 624 is in motion during the lithographic projection. In the case where the stage 624 is moving, during the lithographic projection, the pattern on the DPG 618 may be dynamically adjusted to compensate for the motion such that the projected pattern moves in correspondence with the wafer movement. The stage 624 may be configured for linear motion or rotary motion.

Conclusion

The above disclosure provides innovative apparatus and methods for the generation of a high-voltage electron beam. The apparatus and methods may be advantageously utilized for electron beam lithography, electron beam imaging, or other applications.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A high-voltage electron gun comprising:
   an insulator stand-off having first and second open ends;
   a resistive layer on the insulator stand-off, wherein the resistive layer is at least on an interior surface of the insulator stand-off;
   a cathode holder coupled to the first open end of the insulator stand-off, wherein the cathode holder holds a cathode emitter from which electrons are emitted;
   an anode coupled to the second open end of the insulator stand-off and having an opening through which an electron beam formed from the emitted electrons is output;
   a first control electrode which is positioned within the insulator stand-off between the cathode holder and the anode;
   a first electrical connection through the insulator stand-off to the first control electrode;
   a second control electrode which is positioned within the insulator stand-off between the first control electrode and the anode, wherein the first control electrode is smaller than the second control electrode such that the first control electrode is farther away from the electron beam than the second control electrode, and an inner diameter of the second control electrode is smaller than an inner diameter of the first control electrode; and
   a second electrical connection through the insulator stand-off to the second control electrode;
   a third control electrode which is positioned within the insulator stand-off between the second control electrode and the anode, wherein the second control electrode is smaller than the third control electrode such that the second control electrode is farther away from the electron beam than the third control electrode, and an inner diameter of the third control electrode is smaller than the inner diameter of the second control electrode; and
   a third electrical connection through the insulator stand-off to the third control electrode.

2. The electron gun of claim 1, wherein voltages are applied to the anode and the cathode such that electrons in the electron beam have an average energy in a range from 10 kilo-electron-volts to 1 mega-electron-volt.

3. The electron gun of claim 1, further comprising:
   a fourth control electrode which is positioned within the insulator stand-off between the third control electrode and the anode, wherein the fourth control electrode is smaller than the third control electrode such that the fourth control electrode is farther away from the electron beam than the third control electrode; and
   a fourth electrical connection through the insulator stand-off to the fourth electrode.

4. The electron gun of claim 1, wherein the insulator stand-off is cylindrical, and the first and second open ends each comprise a circular end.

5. The electron gun of claim 1, wherein the resistive layer comprises a mixture of metal and metal-oxide.

6. The electron gun of claim 1, wherein the resistive layer comprises a ceramic with metal diffused therein.

7. The electron gun of claim 1, wherein the resistive layer comprises diamond-like carbon.

8. The electron gun of claim 1, wherein the resistive layer comprises an anti-static coating.

9. The electron gun of claim 1, wherein the resistive layer comprises silicon chromate.

10. The electron gun of claim 1, wherein the resistive layer has a thickness in a range from 5 nm to 100 microns and a sheet resistance in a range from $10^6$ to $10^{15}$ ohms per square.

11. A method of forming an electron beam in an electron gun, the method comprising:
    emitting electrons from a cathode emitter into a gun chamber with an insulator stand-off which is coated with a resistive layer, wherein the gun chamber is formed by the insulator stand-off, a cathode holder at a first end of the insulator stand-off, and an anode at a second end of the insulator stand-off;
    forming an electron beam in the gun chamber, wherein forming the electron beam comprises applying control voltages to a plurality of control electrodes to focus the electrons within the gun chamber between the cathode holder and the anode, wherein the plurality of control electrodes comprises a first control electrode positioned within the insulator stand-off between the cathode holder and the anode, a second control electrode positioned within the insulator stand-off between the first control electrode and the anode, wherein the first control electrode is smaller than the second control electrode such that the first control electrode has a larger inner diameter and is farther away from the electron beam than the second control electrode, and a third control electrode positioned within the insulator stand-off between the second control electrode and the anode, and wherein the second control electrode is smaller than the third control electrode such that the second control electrode has a larger inner diameter and is farther away from the electron beam than the third control electrode; and
    accelerating the electron beam out of an opening in the anode.

12. The method of claim 11, wherein the plurality of control electrodes further comprises a fourth control electrode positioned within the insulator stand-off between the third control electrode and the anode, and wherein the fourth control electrode is smaller than the third control electrode such that the fourth control electrode is farther away from the electron beam than the third control electrode.

13. An apparatus for electron beam lithography, the apparatus comprising:
   an electron gun for emitting an incident electron beam, the electron gun having a cathode, an anode, and a resistive-layer coated insulator stand-off between the cathode and the anode;
   a plurality of control electrodes which are positioned within the insulator stand-off, wherein the plurality of control electrodes comprises
      a first control electrode which is positioned within the insulator stand-off between the cathode and the anode of the electron gun,
      a second control electrode which is positioned within the insulator stand-off between the first control electrode and the anode, wherein the first control electrode is smaller than the second control electrode such that the first control electrode has a larger inner diameter and is farther away from the incident electron beam than the second control electrode,
      a third control electrode which is positioned within the insulator stand-off between the second control electrode and the anode, wherein the second control electrode is smaller than the third control electrode such that the second control electrode has a larger inner diameter and is farther away from the electron beam than the third control electrode, and
      a third electrical connection through the insulator stand-off to the third control electrode;
   an electrical connection through the insulator stand-off to each electrode of the plurality of control electrodes;
   a pattern generator array being illuminated by the incident electron beam and reflecting a patterned array of electron beams;
   an imaging system which focuses and de-magnifies the patterned array of electron beams; and
   a stage for holding a target substrate under the patterned array of electron beams.

14. The apparatus of claim 13, wherein electrons in the incident electron beam have an average energy in a range from 10 kilo-electron-volts to 1 mega-electron-volt.

15. The apparatus of claim 13, wherein the plurality of control electrodes further comprises a fourth control electrode which is positioned within the insulator stand-off between the third control electrode and the anode, wherein the fourth control electrode is smaller than the third control electrode such that the fourth control electrode is farther away from the incident electron beam than the third control electrode.

* * * * *